United States Patent
Hobbel

(10) Patent No.: US 7,742,387 B2
(45) Date of Patent: Jun. 22, 2010

(54) CANCELLATION OF CROSSTALK ENERGY IN COMMUNICATION LOOPS

(75) Inventor: Jan C. Hobbel, Larkspur, CA (US)

(73) Assignee: New Wire Systems, Inc., Petaluma, CA (US)

( * ) Notice: Subject to any disclaimer, the term of this patent is extended or adjusted under 35 U.S.C. 154(b) by 773 days.

(21) Appl. No.: 11/400,016

(22) Filed: Apr. 7, 2006

(65) Prior Publication Data
US 2007/0004286 A1 Jan. 4, 2007

Related U.S. Application Data

(60) Provisional application No. 60/670,782, filed on Apr. 12, 2005.

(51) Int. Cl.
  H04J 1/12 (2006.01)
  H04B 3/10 (2006.01)
  H01R 24/00 (2006.01)
  H04M 9/08 (2006.01)

(52) U.S. Cl. ............... 370/201; 370/286; 379/417; 439/941

(58) Field of Classification Search .......... 370/201, 370/286–289, 292, 282; 439/941; 379/417, 379/3, 406.01; 725/127; 375/222
See application file for complete search history.

(56) References Cited

U.S. PATENT DOCUMENTS

| | | | | |
|---|---|---|---|---|
| 5,991,308 A * | 11/1999 | Fuhrmann et al. | ...... | 370/395.53 |
| 6,231,397 B1 * | 5/2001 | de la Borbolla et al. | ..... | 439/676 |
| 6,317,495 B1 * | 11/2001 | Gaikwad et al. | ............ | 379/417 |
| 6,377,640 B2 * | 4/2002 | Trans | ......................... | 375/354 |
| 6,520,807 B2 * | 2/2003 | Winings | ..................... | 439/676 |
| 6,647,067 B1 | 11/2003 | Hjelm et al. | | |
| 6,970,560 B1 * | 11/2005 | Hench et al. | ............... | 379/417 |
| 7,058,125 B2 * | 6/2006 | Cherubini | ................... | 375/225 |
| 7,154,845 B1 | 12/2006 | Barrass et al. | | |
| 7,164,764 B2 * | 1/2007 | Zimmerman et al. | ........ | 379/417 |
| 7,394,752 B2 * | 7/2008 | Hasegawa et al. | ........... | 370/201 |
| 7,551,544 B2 * | 6/2009 | Laakso et al. | ............... | 370/201 |
| 2002/0118652 A1 * | 8/2002 | Ahmed et al. | ............... | 370/286 |
| 2003/0027462 A1 * | 2/2003 | Winings | ..................... | 439/701 |
| 2003/0099350 A1 * | 5/2003 | Bostoen et al. | ............. | 379/417 |
| 2003/0117963 A1 * | 6/2003 | Wang | ......................... | 370/252 |

(Continued)

OTHER PUBLICATIONS

Transmission and Multiplexing TM; Access Transmission System on metalllic access cables; Symmetric single pair high bitrate Digital subscriber Line (SDSL); ETSI TS 101 524 V1.2.1 (Mar. 2003).*

(Continued)

*Primary Examiner*—Chi H Pham
*Assistant Examiner*—Ahmed Elallam
(74) *Attorney, Agent, or Firm*—Fish & Richardson P.C.

(57) ABSTRACT

Systems and methods for reducing crosstalk are provided. In one implementation, a method is provided. The method includes applying a pilot signal to a disturber twisted pair and measuring near end crosstalk of a victim twisted pair. The coupling characteristics between the disturber and the victim twisted pair are determined. A far end crosstalk function is derived for estimating the far end crosstalk in the victim twisted pair using the determined coupling characteristics. A crosstalk reduction signal is determined using the estimated far end cross talk. The crosstalk reduction signal is injected into the victim twisted pair to reduce crosstalk in the victim twisted pair.

15 Claims, 2 Drawing Sheets

U.S. PATENT DOCUMENTS

| | | |
|---|---|---|
| 2004/0090927 A1* | 5/2004 | Zimmerman et al. ........ 370/268 |
| 2004/0095921 A1* | 5/2004 | Kerpez ....................... 370/351 |
| 2004/0170230 A1 | 9/2004 | Zimmerman et al. |
| 2004/0218756 A1 | 11/2004 | Tang et al. |
| 2005/0220180 A1* | 10/2005 | Barlev et al. ................ 375/222 |
| 2005/0237954 A1* | 10/2005 | Hasegawa et al. ........... 370/292 |
| 2005/0259725 A1 | 11/2005 | Cioffi |
| 2006/0274893 A1* | 12/2006 | Cioffi et al. ............ 379/399.01 |

OTHER PUBLICATIONS

Lee et al., "Binder MIMO Channels", IEEE Trans. on Communications, vol. 55(8), pp. 1617-1628 (Aug. 2007).

* cited by examiner

CANCELLATION OF CROSSTALK ENERGY IN COMMUNICATION LOOPS

CROSS-REFERENCE TO RELATED APPLICATIONS

This application claims priority to U.S. Provisional Patent Application Ser. No. 60/670,782, filed on Apr. 12, 2005, which is hereby incorporated by reference in its entirety.

BACKGROUND

The present invention relates to communication systems.

Some communications systems, for example, digital subscriber line ("DSL") systems, transmit signals in a differential mode using two conductors that can be formed in a twisted pair transmission line. Twisted pair transmission lines can be co-located with other transmission lines in a binder (e.g., a cable). Each twisted pair forms a loop (i.e., when connected to a termination device) and can suffer from crosstalk interference (or simply crosstalk) when bundled with other pairs.

On loop lengths short enough to support Asymetric Digital Subscriber Line 2 plus ("ADSL2+") or Very-high bit rate Digital Subscriber Line ("VDSL") data rates greater than 12 Mbps, far-end crosstalk interference ("FEXT") can become the dominant contributor to degrading the signal to noise ratio at a victim receiver. In conventional systems, FEXT can limit the rate and reach of DSL signals greater than 8 Mbps.

Recent efforts to improve DSL performance through crosstalk reduction have focused on so called multiple-input, multiple output ("MIMO") processing schemes. These schemes attempt to characterize the crosstalk relationship between twisted pairs. The primary drawbacks of a conventional MIMO scheme are computational complexity, error due to ingress noise and signal attenuation, requirements that both ends of the communication network be upgraded, and long lag time associated with updating the MIMO information.

Efforts to improve network performance also include work in the area of dynamic spectrum management ("DSM"), in which the frequency and power usage of transmission lines are adjusted to achieve a desired performance in a manner that is least detrimental to other transmission lines. DSM is generally a scheme to coordinate different DSL lines within a binder in a way that avoids crosstalk. In the highest performance mode, the transmitters' power spectrum densities are adjusted dynamically to optimize overall network performance. Conventional DSM is an avoidance scheme and not a cancellation scheme and, thus, has limited effectiveness as the density of DSL signals in a binder increases.

Improved cabling is another area of focus for improving network performance. Although improved cabling can provide better immunity from disturber transmission lines and reduce crosstalk interference to other transmission lines and services, the use of improved cabling may be infeasible in many situations. Replacing existing cables can be expensive (due to material and labor costs), time consuming, and disruptive to service. Furthermore, existing conduits in buildings are often not large enough to accommodate the larger cables that have improved shielding, and replacing these conduits may be difficult or impossible.

SUMMARY

Systems and methods for reducing crosstalk are provided. In general, in one implementation, a method is provided. The method includes applying a pilot signal to a disturber twisted pair and measuring near end crosstalk of a victim twisted pair. The coupling characteristics between the disturber and the victim twisted pair are determined. A far end crosstalk function is derived for estimating the far end crosstalk in the victim twisted pair using the determined coupling characteristics. A crosstalk reduction signal is determined using the estimated far end cross talk. The crosstalk reduction signal is injected into the victim twisted pair to reduce crosstalk in the victim twisted pair.

Implementations of the method can include one or more of the following features. Determining the coupling characteristics can include using the applied pilot signal and the measured near end crosstalk. The using can include comparing the amplitude and phase of the pilot signal with amplitude and phase of the near end crosstalk signal. Deriving the far end crosstalk function for the victim twisted pair can include using the determined coupling characteristics with a crosstalk model. Estimating the far end crosstalk can include using the pilot signal and the derived far end crosstalk function.

Determining the crosstalk reduction signal can include inverting the estimated far end crosstalk. Determining the crosstalk reduction signal can include determining a crosstalk signal such that destructive incident wave superposition is provided. Reducing crosstalk in the victim twisted pair can include canceling the crosstalk in the victim twisted pair.

The method can further include verifying the far end crosstalk reduction. Verifying can include estimating the near end crosstalk using the determined coupling characteristics and comparing the estimated near end crosstalk with the measured near end crosstalk to verify the determined coupling characteristics. If the result of the comparison is greater than a threshold value then the coupling characteristics can be re-determined. The method can further include monitoring the FEXT reduction including using the measured NEXT in a feedback loop to detect changes in the coupling characteristics.

In general, in another implementation, a system is provided. The system includes a disturber twisted pair and a victim twisted pair. The system also includes a crosstalk canceller. The crosstalk canceller is configured to detect near end crosstalk in the victim pair, estimate far end crosstalk in the victim pair, and generate a crosstalk reduction signal for injection into the victim twisted pair.

In general, in one aspect, a crosstalk cancellation device is provided. The crosstalk cancellation device includes a detector operable to detect near end crosstalk in a victim twisted pair. The device also includes an estimator operable to estimate far end crosstalk in the victim twisted pair and a generator operable to generate a crosstalk reduction signal for injection into the victim twisted pair.

Particular embodiments of the invention can be implemented to realize one or more of the following advantages. Crosstalk cancellation as described below can be used to effectively isolate each twisted-pair transmission line in a bundle. Such isolation, for example, can allow each circuit (e.g., DSL circuit) to operate at a near possible maximum rate as limited by the frequency response characteristics of the twisted wire pair. Crosstalk cancellation as described below can cancel or attenuate crosstalk energy in the transmission lines and not just at the nodes. Unlike conventional crosstalk cancellation, which is typically a dual end implementation (i.e., implemented at both ends of a transmission line), crosstalk cancellation can be implemented at a single end of a transmission line. Real time or near real time feedback of the efficacy of the noise cancellation can be made and appropriate adjustments can be implemented.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Terms and Conventions

Figure 1:
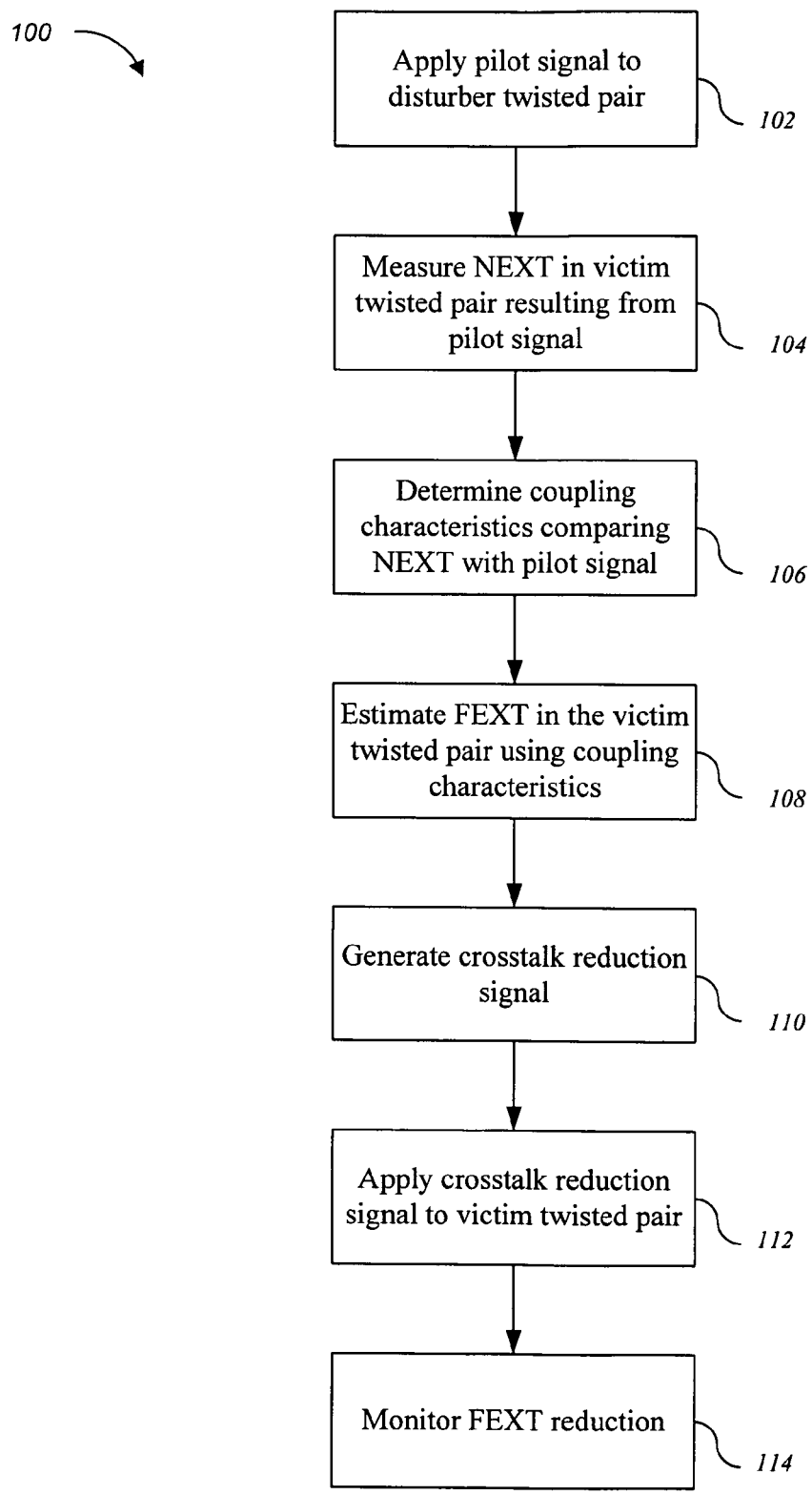
FIG. 1 shows an example method for reducing crosstalk.

"Crosstalk" as generally used herein refers to the electrical coupling of a signal on one twisted pair transmission line (disturber twisted pair) to other twisted pair transmission lines (victim twisted pairs) resulting in interference of the intended signal on the other victim twisted pair transmission lines.

"NEXT" (or near-end crosstalk) as generally used herein generally refers to crosstalk signal interference imposed by the disturber onto the victim twisted pair circuit at the end where the disturber's transmitter is located.

"FEXT" (or far-end cross talk) as generally used herein refers to crosstalk signal interference imposed by the disturber onto the victim twisted pair circuit at the end opposite where the disturber's transmitter is located.

"Binder" as generally used herein refers to a bundled group of twisted pair transmission lines.

"Frequency division multiplexing" ("FDM") as generally used herein refers to a transmission scheme that permits more than one information stream to be sent over a twisted pair transmission line by multiplexing the upstream and downstream information flows in separate frequency bands.

"DSLAM" as generally used herein refers to a digital subscriber line access multiplexer.

"Twisted Wire Pair" (or simply twisted pair) as generally used herein refers to an electrical transmission line constructed of a pair of conductors twisted together and driven with a differentially applied signal between the two conductors.

"Single-ended cancellation" as generally used herein generally refers to a manner in which crosstalk cancellation is implemented. In particular, single ended cancellation can employ a feedback mechanism, for determining the crosstalk and the cancellation of crosstalk between two twisted-pair transmission lines, which is implemented without the need for information from the far-end on what is happening with regards to FEXT.

"Pilot signal" as generally used herein generally refers to a known signal that is applied to a disturber pair and, furthermore, that is monitored on a victim pair to determine a crosstalk function and an efficacy of the crosstalk cancellation.

"Crosstalk function" as generally used herein generally refers to a function that describes the relationship in amplitude and phase of the transfer function between disturber and victim twisted pair transmission lines.

"Downstream" as generally used herein generally refers to a direction at which information flows from a network to a customer.

"Upstream" as generally used herein generally refers to a direction at which information flows from the customer to the network.

"ADSL2+" as generally used herein generally refers to an enhanced version of the second generation of the Asymmetric Digital Subscriber Line standard, which supports downstream information rates up to substantially 24 Mbps. ADSL2+ is defined by ITU-T standard G.992.5, which is hereby incorporated by reference. The ITU-T standard G.992.5 is also known as g.adslplus.

"VDSL2" as generally used herein generally refers to a second generation of a Very-high bit rate Digital Subscriber Line standard, which supports downstream information rates up to substantially 100 Mbps.

Crosstalk Cancellation System

A system is provided that derives a crosstalk function and uses the crosstalk function to generate a crosstalk reduction signal. The system injects the crosstalk reduction signal into a victim twisted pair to cancel or attenuate crosstalk in the victim twisted pair. Crosstalk reduction, including the described derivation and injection, can be single ended.

FIG. 1 shows an example process 100 for reducing crosstalk. A pilot signal is applied to the disturber twisted pair (step 102). The NEXT resulting from the applied pilot signal is measured (step 104). The measured NEXT is used with the pilot signal to determine the coupling characteristics between the disturber and victim twisted pairs (step 106). The coupling characteristics are used to estimate FEXT in the victim twisted pair (step 108), where the FEXT crosstalk is derived according to a crosstalk model as a function of the coupling characteristics between the disturber and victim twisted pairs. A crosstalk reduction signal is determined using the measured NEXT and the derived FEXT crosstalk function (step 110). The crosstalk reduction signal is applied to the victim twisted pair (step 112). The crosstalk reduction signal can reduce or cancel the crosstalk in the victim twisted pair. The FEXT reduction can be monitored (step 114). For example, using a NEXT feedback loop.

Determining NEXT in Victim Twisted Pair

In one implementation, in order to determine NEXT for a victim twisted pair, the system applies a pilot signal to the disturber twisted pair. The pilot signal causes a resulting NEXT in the victim twisted pair according to the particular coupling characteristics between the twisted pairs. The pilot signal and resulting NEXT measured can be used to determine the electric coupling characteristics for the particular disturber and victim twisted pairs. The determined coupling characteristics can then be used to derive crosstalk functions for FEXT and NEXT for the twisted pairs according to the crosstalk model relating the coupling characteristics to FEXT and NEXT respectively.

In one implementation, the coupling characteristics for the twisted pairs are determined by comparing (i) the amplitude and phase of the pilot signal (injected in the disturber twisted pair at the near end) with (ii) the amplitude and phase of the resulting NEXT in the victim twisted pair. The comparison can be performed over a particular target frequency range over which the crosstalk reduction is to be applied.

In one implementation, the pilot signal is provided by a modem such as a DSL modem. The signals provided by the DSL modem can be sensed in the victim twisted pair to measure the resultant NEXT.

FEXT Crosstalk Function Generation

A crosstalk function for estimating the FEXT in the victim twisted pair can be derived. In one implementation, the derivation is based, at least in part, on a relationship between NEXT and FEXT of a transmission line and the coupling characteristics between the disturber and victim twisted pairs.

A crosstalk model relates both NEXT and FEXT as functions of the coupling characteristics of the disturber and victim twisted pairs. Both NEXT and FEXT current can be represented as functions of a coupling capacitance between the disturber and victim twisted pairs, loop insertion gain, and segment length. The coupling capacitance is a function of a radius of the wires in the twisted pairs as well as a distance between the wires of the disturber and victim twisted pairs for a particular segment length.

In one implementation, a crosstalk model is used, which provides FEXT current as a function of the coupling characteristics as shown in Equation 1.

$$i_x = \frac{Z_0 \cdot j\omega}{2} \cdot I(0) |H(f,L)| \sum_{k=0}^{L/\Delta d} C_x(k\Delta d),  \quad \text{(Equation 1)}$$

where x is a combination of wires from the disturber and victim twisted pairs, $Z_0$ is loop impedance, $I(0)$ is a current injected to the disturber twisted pair, $H(f,L)$ is the root of the magnitude of the loop insertion gain, $C(k\Delta d)$ is a coupling capacitance between the disturber and victim twisted pairs, and $\Delta d$ is a segment length of wire in the twisted pairs.

The derived FEXT crosstalk function can be used with the particular determined coupling characteristics to evaluate the FEXT crosstalk function and thereby estimate the FEXT for the victim twisted pair resulting from a particular injected disturber signal.

Thus, by determining the electronic coupling characteristics for the particular disturber and victim twisted pairs, the crosstalk model can be used to estimate FEXT for the disturber and victim twisted pairs. Since the coupling characteristics for the disturber and victim twisted pairs were directly determined according to the measured NEXT, the derivation of the crosstalk function (and subsequent estimation of FEXT) does not require a measurement of actual FEXT at the far end of the victim twisted pair.

In one implementation, the crosstalk reduction signal is generated and applied to the victim twisted pair. The crosstalk reduction signal is generated including applying the observed (or sensed) pilot signal injected in the disturber and applying it the derived FEXT function, resulting in an estimated FEXT resulting from the pilot signal. The result is inverted and applied to the victim twisted pair such that through destructive incident wave superposition, the crosstalk energy in the victim twisted pair can be reduced or cancelled. Additionally, the applied reduction signal also reduces the NEXT in the victim twisted pair. The magnitude of the NEXT reduction depends on the length of the wire. For shorter loops, the NEXT is greatly attenuated, while longer loops result in less NEXT attenuation.

In one implementation, the measured NEXT can be used in a feedback loop to detect changes in the electrical coupling characteristics between the disturber and victim twisted pairs. Using the feedback loop, the effectiveness of the FEXT cancellation can be monitored and corrected.

Additionally, the determined coupling characteristics can be used to estimate the NEXT using a crosstalk function describing NEXT in the victim twisted pair as a function of the coupling characteristics. As discussed above, both NEXT and FEXT are functions of the coupling characteristics for particular twisted pairs according to a crosstalk model. Thus, the NEXT crosstalk function can be derived according to the model in a similar manner as the FEXT crosstalk function above. The determined coupling characteristics can then be used to estimate the NEXT for the victim twisted pair.

The estimated NEXT can be compared with the detected NEXT. When the estimated NEXT does not correlate well with the detected NEXT, the electrical coupling between the disturber and victim twisted pairs may have changed. Consequently, the derived crosstalk function describing FEXT in the victim twisted pair may need to be changed/updated. In one implementation, if the loss of correlation between the detected and estimated NEXT exceeds a threshold value, the electrical coupling characteristics of an associated victim twisted pair can be re-derived in order to derive a new FEXT crosstalk function.

In one implementation, the electrical crosstalk coupling between the twisted pairs is a linear system such that the transfer characteristics are substantially the same regardless of which twisted pair is the disturber or the victim. Thus, once the crosstalk function is derived for an implementation in which a first twisted pair is the disturber and a second twisted pair is the victim, the same crosstalk function can be applied when the second twisted pair is viewed as the disturber and the first twisted pair is the victim.

The estimation of FEXT derived by determining the coupling characteristics for the disturber and victim twisted pairs using sensed NEXT can generally be more accurate than an estimation of FEXT obtained by measurement of actual FEXT at the far end. The measured near-end NEXT signal level, from which the coupling characteristics and therefore, the FEXT estimation is derived, is usually less distorted, less attenuated, and less susceptible to ingress interference than is the FEXT signal level measured at the far end. The estimation of FEXT derived by sensing near-end NEXT, thus, inherently has a much higher signal to noise ratio and so can generate a more accurate estimate.

Figure 2:
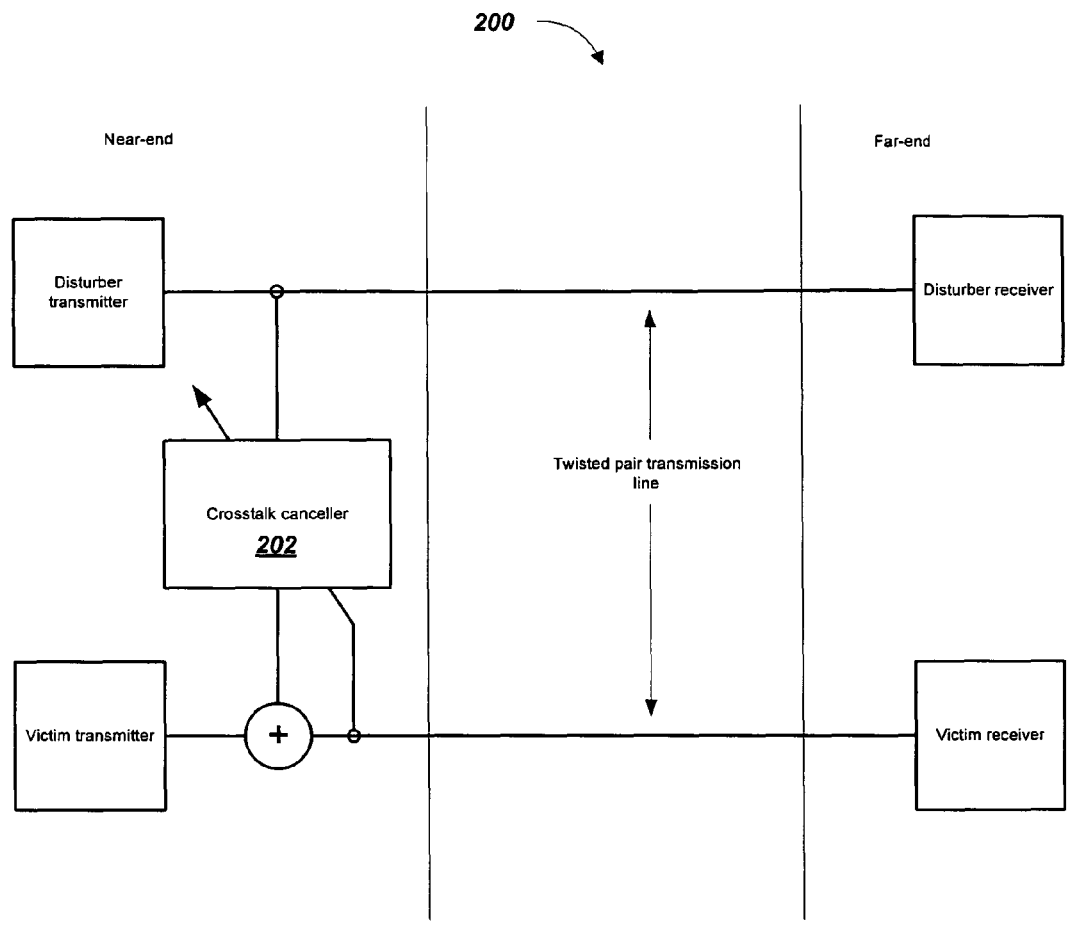
FIG. 2 shows a communication system.

FIG. 2 shows one implementation of a system in which crosstalk cancellation can be implemented. The system 200 shown includes a crosstalk canceller 202 that is located and connected at a near end. The crosstalk canceller 202 is configured to sense NEXT in a victim twisted pair and to derive, from the sensed NEXT, a crosstalk function that describes FEXT in the victim twisted pair. The crosstalk canceller 202 is further configured to generate a signal that, when injected into the victim twisted pair, attenuates or cancels FEXT for the length of the victim twisted pair (e.g., and not only at the far end).

Note that, unlike conventional NEXT cancellation, methods and apparatus as described herein cancel the crosstalk energy in a victim twisted pair as opposed to in the digital or analog domain of a DSL transceiver circuit. That is, crosstalk in the twisted pair loop is cancelled. In contrast, conventional systems cancel crosstalk only at the nodes and not in the twisted pair loop itself.

Because the apparatus (and/or systems, devices, methods, etc.) described above sense crosstalk on twisted pairs independent of a carrier modulation method, the apparatus can be transparent to DSL technology and/or protocols and, thus, can be compatible with, for example, any FDM type of ADSL, ADSL2+, VDSL, or VDSL2.

Methods and apparatus described can cancel crosstalk between two different DSL types. By way of example, crosstalk imposed on a VDSL circuit by a T1 circuit can be cancelled using the methods and apparatus as described.

As discussed above, methods and apparatus as described herein can provide real time or near real time feedback of the efficacy of crosstalk cancellation. Because of the relationship between NEXT and FEXT, methods and apparatus as described herein can sense, in real time or near real time, when the crosstalk function between two twisted pairs changes and requires an adjustment. These changes can be, for example, the result of (i) environmental conditions changing the electrical characteristics of the twisted pair and/or the binder or (ii) changes in the way the pairs are connected at either end as result of equipment being connected and/or disconnected.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in an information carrier, e.g., in a machine-readable storage device or in a propagated signal, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

A number of embodiments of the invention have been described. Nevertheless, it will be understood that various modifications may be made without departing from the spirit and scope of the invention. For example, the actions described above can be performed in a different order and still achieve desirable results. Accordingly, other embodiments are within the scope of the following claims.

What is claimed is:

1. A method, comprising:
   applying a pilot signal to a disturber twisted pair;
   measuring near end crosstalk (NEXT) of a victim twisted pair;
   determining coupling characteristics between the disturber and the victim twisted pair based on the measured NEXT;
   deriving a far end crosstalk function for estimating far end crosstalk (FEXT) in the victim twisted pair using the determined coupling characteristics;
   determining a crosstalk reduction signal using the far end crosstalk function; and
   injecting the crosstalk reduction signal into the victim twisted pair to reduce crosstalk in the victim twisted pair.

2. The method of claim 1, where determining the coupling characteristics includes using the applied pilot signal and the measured near end crosstalk.

3. The method of claim 2, where determining the coupling characteristics includes:
   comparing an amplitude and a phase of the pilot signal with an amplitude and phase of the measured near end crosstalk signal; and
   determining the coupling characteristics based on the comparison.

4. The method of claim 1, where deriving the far end crosstalk function for the victim twisted pair includes using the determined coupling characteristics with a crosstalk model.

5. The method of claim 1, further comprising:
   estimating the far end crosstalk using the pilot signal and the derived far end crosstalk function,
   where determining a crosstalk reduction signal using the far end crosstalk function includes determining the crosstalk reduction signal using the estimated far end crosstalk.

6. The method of claim 1, further comprising:
   estimating the far end crosstalk using the derived far end crosstalk function,
   where determining the crosstalk reduction signal includes inverting the estimated far end crosstalk.

7. The method of claim 1, where determining the crosstalk reduction signal includes determining a crosstalk signal such that destructive incident wave superposition is provided.

8. The method of claim 1, where injecting the crosstalk reduction signal into the victim twisted pair to reduce crosstalk in the victim twisted pair includes canceling the crosstalk in the victim twisted pair.

9. The method of claim 1, further comprising:
   verifying the far end crosstalk reduction, including:
      estimating the near end crosstalk using the determined coupling characteristics; and
      comparing the estimated near end crosstalk with the measured near end crosstalk to verify the determined coupling characteristics.

10. The method of claim 9, further comprising:
    re-determining the coupling characteristics if the result of the comparison is greater than a threshold value.

11. The method of claim 10, where monitoring the FEXT reduction includes using the measured NEXT in a feedback loop to detect changes in the coupling characteristics.

12. The method of claim 1, further comprising:
monitoring the FEXT reduction.

13. The method of claim 1, further comprising:
determining a near end crosstalk function describing the near end crosstalk in the victim twisted pair as a function of the coupling characteristics,
where measuring the near end crosstalk includes estimating the near end crosstalk using the determined near end crosstalk function.

14. The method of claim 1, further comprising:
estimating the near end crosstalk using the coupling characteristics;
comparing the estimated near end crosstalk with the measured near end crosstalk; and
determining a change associated with the far end crosstalk based on the comparison.

15. The method of claim 1, further comprising:
estimating the near end crosstalk using the coupling characteristics;
re-determining the coupling characteristics if a difference between the estimated near end crosstalk and the measured near end crosstalk exceeds a predetermined threshold; and
re-deriving the far end crosstalk function using the re-determined coupling characteristics.

* * * * *

UNITED STATES PATENT AND TRADEMARK OFFICE
CERTIFICATE OF CORRECTION

PATENT NO. : 7,742,387 B2  Page 1 of 1
APPLICATION NO. : 11/400016
DATED : June 22, 2010
INVENTOR(S) : Jan C. Hobbel It is certified that error appears in the above-identified patent and that said Letters Patent is hereby corrected as shown below:

On the Title Pg Item (56), References Cited, Other Publications; delete

"metalllic access cables; Symmetric single high bitrate Digital" and insert

-- metallic access cables; Symmetric single high bitrate Digital --, therefor.

Column 8, Line 12 delete:

"applying a pilot signal to a disturber twisted pair;" and insert

-- applying, by a transmitter, a pilot signal to a disturber twisted pair; --, therefor.

Signed and Sealed this

Fifth Day of October, 2010

David J. Kappos
*Director of the United States Patent and Trademark Office*